United States Patent
Zong et al.

(10) Patent No.: US 11,836,016 B2
(45) Date of Patent: Dec. 5, 2023

(54) INTERCONNECTING DEVICE FOR SIGNAL PLATE AND INTERCONNECTING METHOD THEREFOR

(71) Applicant: ZHENGZHOU YUNHAI INFORMATION TECHNOLOGY CO., LTD., Henan (CN)

(72) Inventors: Yanyan Zong, Henan (CN); Wei Gong, Henan (CN)

(73) Assignee: ZHENGZHOU YUNHAI INFORMATION TECHNOLOGY CO., LTD., Henan (CN)

( * ) Notice: Subject to any disclaimer, the term of this patent is extended or adjusted under 35 U.S.C. 154(b) by 485 days.

(21) Appl. No.: 17/272,947

(22) PCT Filed: Aug. 30, 2019

(86) PCT No.: PCT/CN2019/103668
§ 371 (c)(1),
(2) Date: Mar. 3, 2021

(87) PCT Pub. No.: WO2020/063254
PCT Pub. Date: Apr. 2, 2020

(65) Prior Publication Data
US 2021/0325945 A1    Oct. 21, 2021

(30) Foreign Application Priority Data

Sep. 25, 2018  (CN) ......................... 201811114134.0

(51) Int. Cl.
*G06F 1/18* (2006.01)
*G06F 1/20* (2006.01)
*H05K 7/14* (2006.01)

(52) U.S. Cl.
CPC ................ *G06F 1/183* (2013.01); *G06F 1/20* (2013.01); *H05K 7/1438* (2013.01)

(58) Field of Classification Search
CPC .......... G06F 1/183; G06F 1/20; H05K 7/1438
(Continued)

(56) References Cited

U.S. PATENT DOCUMENTS 6,608,762 B2    8/2003    Patriche

FOREIGN PATENT DOCUMENTS

CN      102841638 A  *  12/2012
CN      102984881 A  *  3/2013
(Continued)

OTHER PUBLICATIONS

International Search Report for PCT/CN2019/103668 dated Dec. 4, 2019, ISA/CN.

*Primary Examiner* — Andargie M Aychillhum
(74) *Attorney, Agent, or Firm* — Yue (Robert) Xu; Apex Attorneys at Law, LLP

(57) ABSTRACT

An interconnecting device for a signal plate and an interconnecting method therefor, relating to the technical field of server signal plate interconnection. The interconnecting device includes a back plate and a fine-adjustment device. The back plate includes a transverse plate and a vertical plate. Multiple sliding grooves are provided on the transverse plate and the vertical plate. A fine-adjustment device is provided on two sides of each of the sliding grooves. The interconnecting method for the signal plate comprises the following steps: (I) an IO plate is inserted into a vertical plate, (II) a CPU plate is inserted into a transverse plate; and (III) the IO plate and the CPU plate are finely adjusted and inserted.

4 Claims, 3 Drawing Sheets

(58) Field of Classification Search
USPC .......................................................... 361/788
See application file for complete search history.

(56) References Cited

FOREIGN PATENT DOCUMENTS

| | | |
|---|---|---|
| CN | 203606745 U | 5/2014 |
| CN | 103974538 A | 8/2014 |
| CN | 104080308 A | 10/2014 |
| CN | 107479657 A | 12/2017 |
| CN | 109358710 A | 2/2019 |
| EP | 2945470 A1 | 11/2015 |

* cited by examiner

INTERCONNECTING DEVICE FOR SIGNAL PLATE AND INTERCONNECTING METHOD THEREFOR

The present application is a national phase application of PCT international patent application PCT/CN2019/103668, filed on Aug. 30, 2019, which claims priority to Chinese Patent Application No. 201811114134.0, titled "INTERCONNECTING DEVICE FOR SIGNAL PLATE AND INTERCONNECTING METHOD THEREFOR", filed with the China National Intellectual Property Administration on Sep. 25, 2018, which is incorporated herein by reference in its entirety.

FIELD

The present disclosure relates to the technical field of interconnection of server signal plates, in particular to an interconnecting device for signal plates and an interconnecting method therefor.

BACKGROUND

With the development of technology, the complexity of a server is increasing, and at the same time, the signal rate is also increasing. At present, signal transmission is realized mainly by a conventional orthogonal connector. The connection method of the conventional orthogonal connector is as follows: two opposite sides of a backplane provided with slots are respectively connected with a male connector by insertion, each male connector is inserted into a female connector, and each female connector is connected to an interconnecting plate. Since the connection method results in overlap of plates, the generated heat is not easy to dissipate, which will have a very large adverse effect on the heat dissipation of the backplane.

SUMMARY

An object of the present disclosure is to provide an interconnecting device for signal plates and an interconnecting method therefor, to solve the problem of heat dissipation on a backplane.

The technical solutions according to the present disclosure for the above technical problem are as follows.

An interconnecting device for signal plates includes a backplane, and further includes fine-adjustment devices. The backplane includes a transverse plate and a vertical plate, the vertical plate is provided on one side of the transverse plate, and a lower end of the transverse plate is fixed to the vertical plate. Multiple first sliding grooves are provided on the transverse plate, a low speed connector is connected to each of the first sliding grooves, and the low speed connector is provided on a front side of the transverse plate. Two fine-adjustment devices are provided on left and right sides of each of the first sliding grooves, respectively, and the fine-adjustment devices and the low speed connector of the traverse plate are provided on the same side. Multiple second sliding grooves are provided on the vertical plate, each of second sliding grooves is connected to one low speed connector, and the low speed connector of the vertical plate is provided on a rear side of the vertical plate. Two fine-adjustment devices are provided on upper and lower sides of each of the second sliding grooves, respectively, and the fine-adjustment devices of the vertical plate are provided on the rear side of the vertical plate.

The first sliding groove on the transverse plate is a horizontal long groove, and the horizontal long groove is a through groove. A bolt, passing through the low speed connector and the first sliding groove, connects the low speed connector to the transverse plate. The second sliding groove on the vertical plate is a vertical long groove, and the vertical long groove is a through groove. Another bolt, passing through the low speed connector and the second sliding groove, connects the low speed connector to the vertical plate.

The fine-adjustment device includes a fixing plate, an adjustment bolt and an adjustment gasket. The fixing plate is a rectangular plate, and a screw hole is provided in the middle of the rectangular plate, the adjustment bolt is provided in the screw hole, and the adjustment gasket is provided on a protruding end of the adjustment bolt.

The fixing plate of the fine-adjustment device provided on the transverse plate is fixed on the front side of the transverse plate, and the fixing plate of the fine-adjustment device provided on the vertical plate is fixed on the rear side of the vertical plate.

The adjustment gasket is a circular plate, and the adjustment gasket is made of rubber material.

An interconnecting method for signal plates includes the following steps: step (1) inserting an IO plate into a vertical plate, step (2) inserting a CPU plate into a transverse plate, and step (3) connecting the IO plate with the CPU plate by insertion after fine adjustment.

In step (1), one low speed connector on the vertical plate is correspondingly inserted into one IO plate, another low speed connector is provided on a right end of the IO plate, multiple OD connectors are further provided on the IO plate, and the IO plate is pressed forward from a rear side of the vertical plate.

In step (2), another low speed connector on the transverse plate is correspondingly inserted into one CPU plate, another low speed connector is provided on an upper end of the CPU plate, multiple OD connectors are further provided on the CPU plate, and the CPU plate is pressed backward from a front side of the transverse plate.

In step (3), fine-adjustment devices at two ends of each low speed connector on the vertical plate are adjusted to move the IO plate up and down, until the OD connectors on the IO plate are aligned with the OD connectors on the corresponding CPU plate in a vertical direction; and fine-adjustment devices at two ends of each low speed connector on the transverse plate are adjusted to move the CPU plate left and right, until the OD connectors on the CPU plate are aligned with the OD connectors on the corresponding IO plate in a transverse direction.

The effects provided in the content of the present disclosure are only the effects of the embodiment, rather than all the effects of the present disclosure. The above technical solutions have the following advantages or beneficial effects:

1. In the interconnecting device for signal plates and the interconnecting method therefor according to the present disclosure, the backplane has an L-shaped plate structure, and end surfaces of the two interconnecting plates provided with the OD connectors may be inserted into two opposite surfaces of the L-shaped plate, respectively.

2. In the interconnecting device for signal plates and the interconnecting method therefor according to the present disclosure, the two interconnecting plates provided with the OD connectors may be directly connected by insertion at an unobstructed part of the L-shaped plate through the OD connectors provided, which increases the heat dissipation channel.

3. In the interconnecting device for signal plates and the interconnecting method therefor according to the present disclosure, the two interconnecting plates may be inserted into the backplane through the low speed connectors, which, on one hand, is beneficial for signal transmission, and on the other hand, is convenient to locate the positions of the two interconnecting plates inserted on the backplane, so as to realize precise insertion between the two interconnecting plates.

4. In the interconnecting device for signal plates and the interconnecting method therefor according to the present disclosure, the fine-adjustment devices are provided, which can correct the positions of the low speed connectors on the backplane, to achieve precise insertion.

Figure 1:
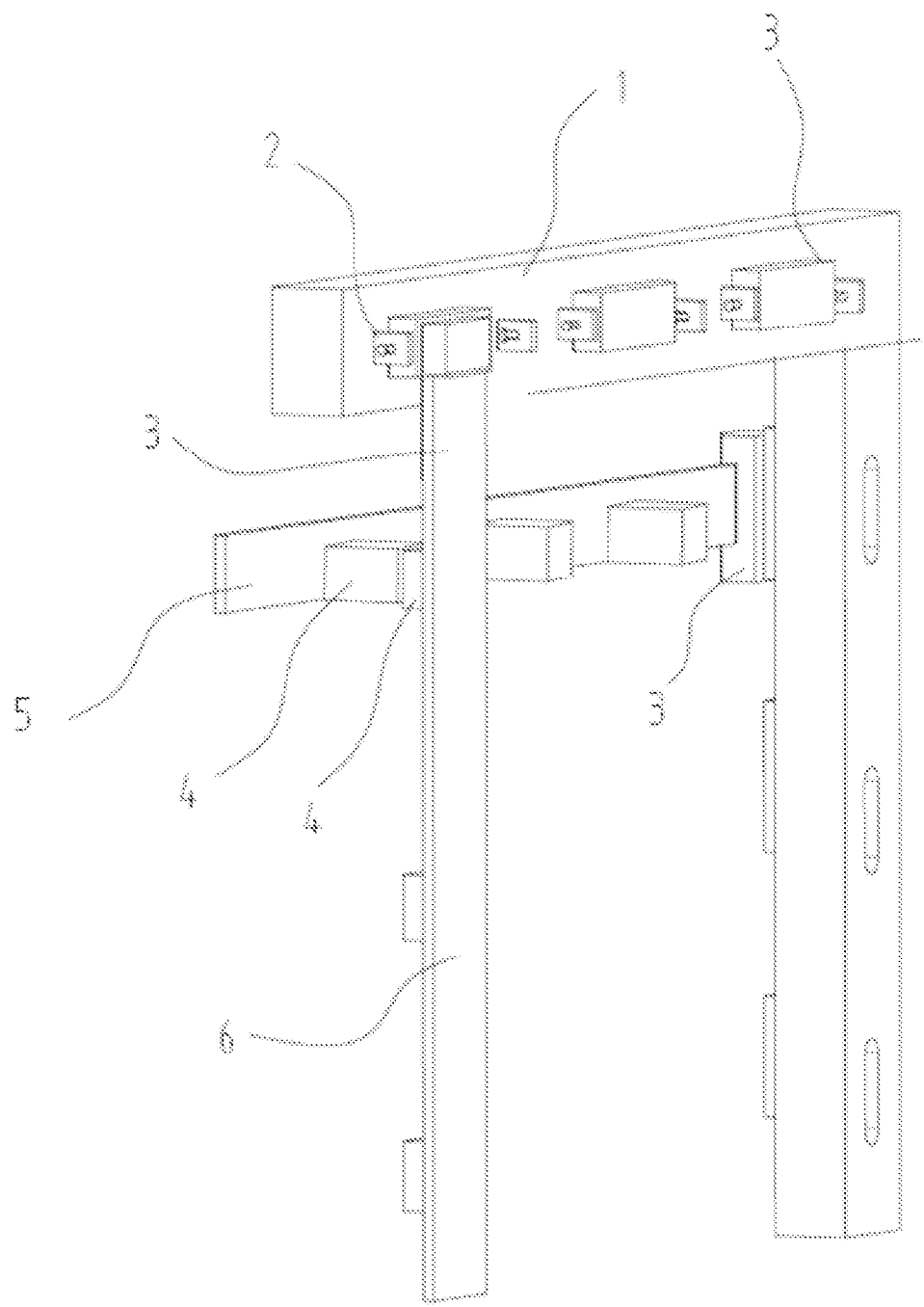
FIG. 1 is a schematic diagram of insertion connection according to an embodiment of the present disclosure.
Figure 2:
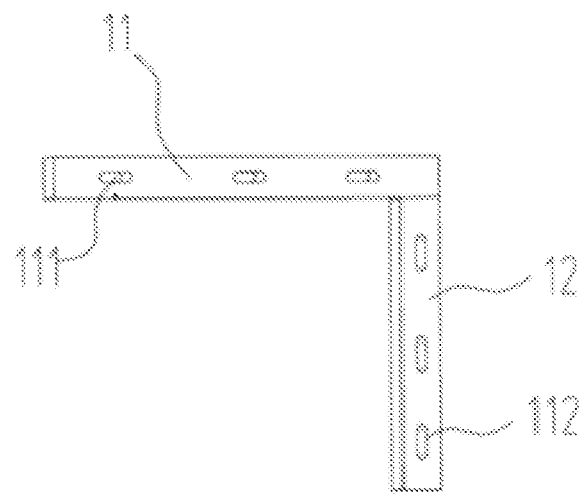
FIG. 2 is a schematic structural diagram of the backplane in FIG. 1.
Figure 3:
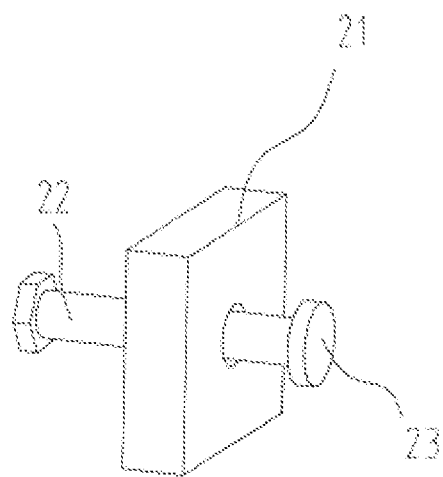
FIG. 3 is a schematic structural diagram of the fine-adjustment device in FIG. 1.
Figure 4:
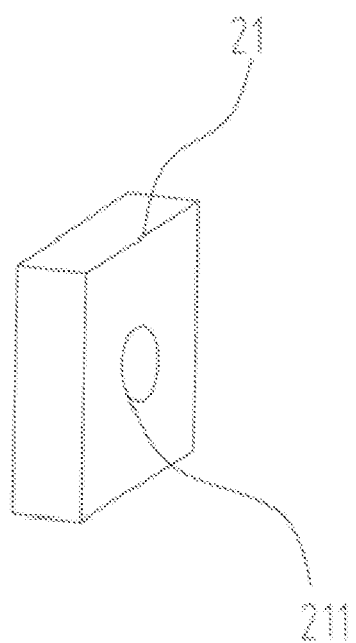
FIG. 4 is a schematic structural diagram of the fixing plate in FIG. 3.

| 1   | backplane,             | 11  | transverse plate,       |
|-----|------------------------|-----|-------------------------|
| 111 | first sliding groove,  | 12  | vertical plate,         |
| 112 | second sliding groove, | 2   | fine-adjustment device, |
| 21  | fixing plate,          | 211 | screw hole,             |
| 22  | adjustment bolt,       | 23  | adjustment gasket,      |
| 3   | low speed connector,   | 4   | OD connector,           |
| 5   | TO plate,              | 6   | CPU plate.              |

DETAILED DESCRIPTION OF THE EMBODIMENTS

In order to clearly illustrate the technical characteristics of the present solution, the present disclosure will be described in detail below through specific embodiments and in conjunction with accompanying drawings 1 to 4. It should be noted that, the components illustrated in the drawings may not be drawn to scale. Descriptions of well-known components and technologies are omitted in the present disclosure to avoid unnecessarily limiting the present disclosure.

An interconnecting device for signal plates includes a backplane 1 and fine-adjustment devices 2. The backplane 1 includes a transverse plate 11 and a vertical plate 12, the vertical plate 12 is provided on one side of the transverse plate 11, and a lower end of the transverse plate 11 is fixed to the vertical plate 12. Multiple first sliding grooves 111 are provided on the transverse plate 11, a low speed connector 3 is connected to each of the first sliding grooves 111, and the low speed connector is provided on a front side of the transverse plate 11. Two fine-adjustment devices 2 are provided on left and right sides of each of the first sliding grooves 111, respectively, and the fine-adjustment devices 2 and the low speed connector 3 of the traverse plate are provided on the same side. Multiple second sliding grooves 112 are provided on the vertical plate 12, each of the second sliding grooves 112 is connected to one low speed connector, and the low speed connector of the vertical plate is provided on a rear side of the vertical plate 12. Two fine-adjustment devices 2 are provided on upper and lower sides of each of the second sliding grooves 112, and the fine-adjustment devices 2 of the vertical plate are provided on the rear side of the vertical plate 12.

The transverse plate 11 and the vertical plate 12 are both rectangular plates, and the transverse plate 11 is fixed to the vertical plate 12 to form an L-shaped structural member.

The first sliding groove 111 on the transverse plate 11 is a horizontal long groove, and the horizontal long groove is a through groove. A bolt, passing through the low speed connector and the first sliding groove 111, connects the low speed connector to the transverse plate 11. The second sliding groove 112 on the vertical plate 12 is a vertical long groove, and the vertical long groove is a through groove. Another bolt, passing through the low speed connector and the second sliding groove 112, connects the low speed connector to the vertical plate 12.

On one hand, the low speed connector plays a role in positioning an IO plate 5 and a CPU plate 6, to facilitate the precise positioning of the IO plate 5 and the CPU plate 6, and on the other hand, it plays a role in transmitting a low speed signal.

The fine-adjustment device 2 includes a fixing plate 21, an adjustment bolt 22 and an adjustment gasket 23. The fixing plate 21 is a rectangular plate, and a screw hole 211 is provided in the middle of the rectangular plate, the adjustment bolt 22 is provided in the screw hole 211, and the adjustment gasket 23 is provided on a protruding end of the adjustment bolt 22.

The adjustment gasket 23 is a circular plate, and the adjustment gasket 23 is made of rubber material.

The fixing plate 21 of the fine-adjustment device 2 provided on the transverse plate 11 is fixed on the front side of the transverse plate 11, and the fine-adjustment device 2 on the transverse plate is able to adjust a position of the low speed connector in a transverse direction. The fixing plate 21 of the fine-adjustment device 2 provided on the vertical plate 12 is fixed on the rear side of the vertical plate 12, and the fine-adjustment device 2 on the vertical plate is able to adjust a position of the low speed connector in a vertical direction.

An interconnecting method for signal plates includes the following steps.

In step (1), an IO plate 5 is inserted into a vertical plate 12, where one low speed connector on the vertical plate 12 is correspondingly inserted into one IO plate 5, another low speed connector is provided on a right end of the IO plate 5, multiple OD connectors 4 are further horizontally provided on the IO plate 5, and the IO plate 5 is pressed forward from a rear side of the vertical plate 12 until the low speed connector of the IO plate 5 is completely connected by insertion with the low speed connector on the vertical plate 12.

In step (2), a CPU plate 6 is inserted into a transverse plate 12, where another low speed connector on the transverse plate 11 is correspondingly inserted into one CPU plate 6, another low speed connector is provided on an upper end of the CPU plate 6, multiple OD connectors are further provided on the CPU plate 6, and the CPU plate 6 is pressed backward from a front side of the transverse plate 11 until the OD connectors on the CPU plate 6 come into contact with the OD connectors on multiple IO plates 5 which are in the same vertical position, while the low speed connector of the CPU plate 6 is being connected by insertion with the low speed connector on the transverse plate 11.

In step (3), the IO plate 5 is connected with the CPU plate 6 by insertion after fine adjustment, where a bolt of the low speed connector fixed on the vertical plate 12 is loosen to allow the low speed connector to move up and down, adjustment bolts 22 of fine-adjustment devices 2 at two ends of the low speed connector are rotated, an adjustment gasket 23 is adjusted to abut against the low speed connector, a position of the low speed connector in a vertical direction is fine-tuned, the low speed connectors on the vertical plate 12 drive the IO plate 5 to move up and down until the OD connectors on the IO plate 5 are aligned with the OD connectors on the corresponding CPU plate 6 in the vertical direction, the bolt is tightened, and the low speed connector is fastened to the vertical plate 12; and a bolt of the low speed connector fixed on the transverse plate 11 is loosen to allow the low speed connector to move left and right, adjustment bolts 22 of fine-adjustment devices 2 at two ends of the low speed connector are rotated, and an adjustment gasket 23 is adjusted to abut against the low speed connector, a position of the low speed connector in a transverse direction is fine-tuned, the low speed connector on the transverse plate 11 drives the CPU plate 6 to move left and right until the OD connectors on the CUP plate 6 are aligned with the OD connectors on the corresponding IO plate 5 in the transverse direction, and then the OD connectors on the CUP plate 6 are plugged into the OD connectors on the corresponding IO plate 5 to connect the CPU plate 6 with the corresponding IO plate 5, and then the bolt is tightened, so that the low speed connector is fastened to the transverse plate 11.

The CPU plate 6 and the IO plate 5 are both interconnecting plates.

Except for the technical features described in the specification, all are techniques known to those skilled in the art.

Although the specific embodiments of the present disclosure are described above with reference to the accompanying drawings, they are not intended to limit the protection scope of the present disclosure. Based on the technical solutions of the present disclosure, various modifications or variations that can be made by those skilled in the art without creative work are still within the protection scope of the present disclosure.

The invention claimed is:

1. An interconnecting device for signal plates, comprising a backplane, further comprising fine-adjustment devices, wherein the backplane comprises a transverse plate and a vertical plate, the vertical plate is provided on one side of the transverse plate, a lower end of the transverse plate is fixed to the vertical plate;

a plurality of first sliding grooves are provided on the transverse plate, a low speed connector is connected to each of the first sliding grooves, and the low speed connector is provided on a front side of the transverse plate; two fine-adjustment devices are provided on left and right sides of each of the first sliding grooves, respectively, and the fine-adjustment devices and the low speed connector of the transverse plate are provided on the same side; and a plurality of second sliding grooves are provided on the vertical plate, each of second sliding grooves is connected to one low speed connector, and the low speed connector of the vertical plate is provided on a rear side of the vertical plate; two fine-adjustment devices are provided on upper and lower sides of each of the second sliding grooves, respectively, and the fine-adjustment devices of the vertical plate are provided on the rear side of the vertical plate.

2. The interconnecting device for signal plates according to claim 1, wherein each first sliding groove on the transverse plate is a horizontal long groove and the horizontal long groove is a through groove, and a bolt, passing through the low speed connector and the first sliding groove, is configured to connect the low speed connector to the transverse plate; and each second sliding groove on the vertical plate is a vertical long groove and the vertical long groove is a through groove, and another bolt, passing through the low speed connector and the second sliding groove, is configured to connect the low speed connector to the vertical plate.

3. The interconnecting device for signal plates according to claim 1, wherein the fine-adjustment device includes a fixing plate, an adjustment bolt and an adjustment gasket; the fixing plate is a rectangular plate, and a screw hole is provided in the middle of the rectangular plate, the adjustment bolt is provided in the screw hole, and the adjustment gasket is provided on a protruding end of the adjustment bolt; and the fixing plate of the fine-adjustment device provided on the transverse plate is fixed on the front side of the transverse plate, and the fixing plate of the fine-adjustment device provided on the vertical plate is fixed on the rear side of the vertical plate.

4. The interconnecting device for signal plates according to claim 3, wherein the adjustment gasket is a circular plate, and the adjustment gasket is made of rubber material.

\* \* \* \* \*